United States Patent
Hsu et al.

(10) Patent No.: US 10,157,781 B2
(45) Date of Patent: Dec. 18, 2018

(54) METHOD FOR FORMING SEMICONDUCTOR STRUCTURE USING POLISHING PROCESS

(71) Applicant: Taiwan Semiconductor Manufacturing Co., Ltd., Hsinchu (TW)

(72) Inventors: Chun-Wei Hsu, Hsinchu (TW); Chi-Jen Liu, Taipei (TW); Cheng-Chun Chang, Taoyuan (TW); Yi-Sheng Lin, Taichung (TW); Pinlei Edmund Chu, Hsinchu (TW); Liang-Guang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/401,238

(22) Filed: Jan. 9, 2017

(65) Prior Publication Data

US 2018/0166331 A1    Jun. 14, 2018

Related U.S. Application Data

(60) Provisional application No. 62/433,853, filed on Dec. 14, 2016.

(51) Int. Cl.
*H01L 21/336* (2006.01)
*H01L 21/768* (2006.01)
(Continued)

(52) U.S. Cl.
CPC .. *H01L 21/76823* (2013.01); *H01L 21/02074* (2013.01); *H01L 21/02244* (2013.01); *H01L 21/32125* (2013.01); *H01L 21/7684* (2013.01); *H01L 21/76805* (2013.01); *H01L 21/76814* (2013.01); *H01L 21/76888* (2013.01); *H01L 21/76895* (2013.01); *H01L 29/66795* (2013.01)

(58) Field of Classification Search
CPC ............. H01L 21/3212; H01L 21/3065; H01L 21/304; H01L 21/7684
See application file for complete search history.

(56) References Cited

U.S. PATENT DOCUMENTS 7,667,271 B2    2/2010    Yu et al.
7,910,453 B2    3/2011    Xu et al.
(Continued)

*Primary Examiner* — Jaehwan Oh
*Assistant Examiner* — John M Parker
(74) *Attorney, Agent, or Firm* — McClure, Qualey & Rodack, LLP

(57) ABSTRACT

Methods for forming semiconductor structures are provided. The method for forming a semiconductor structure includes forming a conductive material in the trench and over a top surface of the material layer and polishing the conductive material with a slurry to expose the top surface of the material layer and to form a conductive structure in the trench. The method for forming a semiconductor structure further includes forming a material layer over a substrate and forming a trench in the material layer. The method for forming a semiconductor structure further includes removing the slurry with a reducing solution. In addition, the reducing solution includes a reducing agent, and a standard electrode voltage of the conductive material is greater than a standard electrode voltage of the reducing agent.

20 Claims, 11 Drawing Sheets

(51) Int. Cl.
  *H01L 29/66* (2006.01)
  *H01L 21/321* (2006.01)
  *H01L 21/02* (2006.01)

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 2002/0016073 A1* | 2/2002 | Kondo | B24B 37/044 438/691 |
| 2004/0110373 A1* | 6/2004 | Liu | H01L 21/02068 438/687 |
| 2004/0224500 A1* | 11/2004 | Cho | H01L 21/288 438/643 |
| 2004/0266188 A1* | 12/2004 | Kondo | C09G 1/04 438/689 |
| 2009/0301894 A1* | 12/2009 | Ehlers | C23C 18/165 205/170 |
| 2014/0001574 A1 | 1/2014 | Chen et al. | |
| 2014/0110755 A1 | 4/2014 | Colinge | |
| 2014/0151812 A1 | 6/2014 | Liaw | |

\* cited by examiner

US 10,157,781 B2

METHOD FOR FORMING SEMICONDUCTOR STRUCTURE USING POLISHING PROCESS

PRIORITY CLAIM AND CROSS-REFERENCE

This Application claims the benefit of U.S. Provisional Application No. 62/433,853, filed on Dec. 14, 2016, and entitled "METHOD FOR FORMING SEMICONDUCTOR STRUCTURE USING POLISHING PROCESS", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in a semiconductor structure is the higher levels of integration of circuits. This is accomplished by miniaturizing or shrinking device sizes on a given chip. As device sizes shrink, tolerances play a more and more important role in the manufacturing process.

Although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
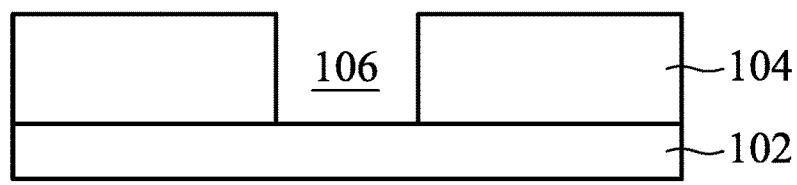
FIGS. 1A to 1D are cross-sectional representations of various stages of forming a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of semiconductor structures and methods for forming the same are provided. The method for forming the semiconductor structure may include performing a chemical mechanical polishing (CMP) process. During the CMP process, a slurry may be used to polish a conductive material and a reducing solution may be used to remove the slurry. In addition, the reducing solution may include a reducing agent which is configured to react with an oxide layer formed over the conductive material so that the performance of the semiconductor structure may be improved.

FIGS. 1A to 1D are cross-sectional representations of various stages of forming a semiconductor structure 100a in accordance with some embodiments. As shown in FIG. 1A, a substrate 102 is provided in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer.

In some embodiments, the substrate 102 includes a device region, and the device region may have various device elements. Examples of device elements may include, but are not limited to, transistors, diodes, and other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and other applicable processes.

A material layer 104 is formed over the substrate 102, as shown in FIG. 1A in accordance with some embodiments. In some embodiments, the material layer 104 is a dielectric layer. In some embodiments, the material layer 104 is an interlayer dielectric layer or an intermetal dielectric layer. The material layer 104 may include multilayers made of multiple dielectric materials, such as a low dielectric constant or an extreme low dielectric constant (ELK) material. In some embodiments, the material layer 104 is made of low-k dielectric materials. In some embodiments, the material layer 104 is made of silicon oxide, silicon nitride, silicon oxynitride, phosphosilicate glass (PSG), borophosphosilicate glass (BPSG), and/or other applicable low-k dielectric materials. In some embodiments, the material layer 104 is formed by performing a chemical vapor deposition (CVD) process, a physical vapor deposition (PVD) process, an atomic layer deposition (ALD) process, a spin-on coating process, or other applicable processes.

After the material layer 104 is formed, a trench 106 is formed in the material layer 104, as shown in FIG. 1A in accordance with some embodiments. The trench 106 may be formed by forming a mask over the material layer 104 and etching the material layer 104 through an opening of the mask. It should be noted that, although the top surface of the substrate 102 shown in FIG. 1A is exposed by the trench 106, the substrate may not be exposed by the trench in some other embodiments.

Figure 1B:
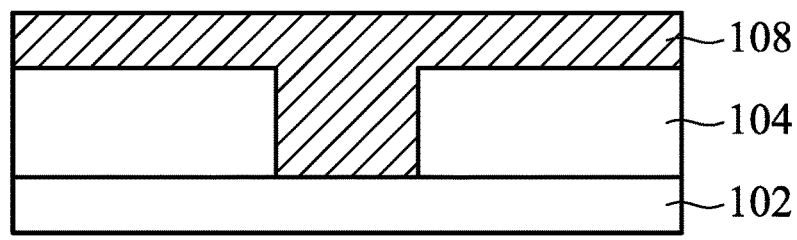

After the trench 106 is formed, a conductive material 108 is formed in the trench 106 and over the top surface of the material layer 104, as shown in FIG. 1B in accordance with some embodiments. In some embodiments, the conductive material 108 includes copper (Cu), tungsten (W), cobalt (Co), aluminum (Al), titanium (Ti), tantalum (Ta), titanium nitride (TiN), tantalum nitride (TaN), nickel silicide (NiS), cobalt silicide (CoSi), tantalum carbide (TaC), tantalum silicide nitride (TaSiN), tantalum carbide nitride (TaCN), titanium aluminide (TiAl), titanium aluminide nitride (TiAlN), other applicable conductive materials, or a combination thereof.

Figure 1C:
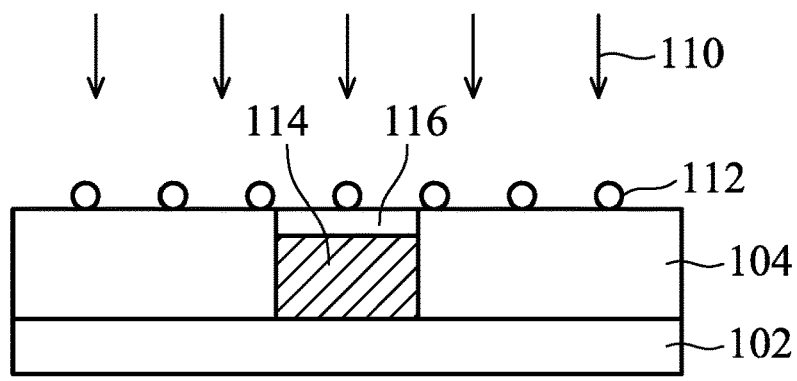

After the conductive material 108 is formed, a polishing process 110 is performed, as shown in FIG. 1C in accordance with some embodiments. The polishing process 110 may be a chemical mechanism polishing process. During the polishing process 110, the slurry 112 is applied onto the conductive material 108 to polish the conductive material 108 formed over the top surface of the material layer 104 in accordance with some embodiments. The slurry 112 may include small, abrasive particles of specific sizes and shapes suspended in an aqueous solution. In some embodiments, the slurry 112 includes $SiO_2$, $Al_2O_3$, $CeO_2$, $ZrO_2$, $TiO_2$, or combinations thereof. In some embodiments, the slurry 112 further includes oxidizers, such as $H_2O_2$, to oxidize the metal than polish the metal oxide for metal CMP. The slurry 112 may also include other chemical additives in some other embodiments.

The polishing process 110 may be performed until a top surface of the material layer 104 is exposed to form a conductive structure 114 in the trenches 106, as shown in FIG. 1C in accordance with some embodiments. As shown in FIG. 1C, after the polishing process 110 is performed, the conductive material 108 that remain in the trench 106 forms the conductive structure 114. In addition, in some embodiments, an oxide layer 116 is formed on top of the conductive structure 114 due to the polishing process. More specifically, a top portion of the conductive structure 114 exposed to the slurry 112 is oxidized during the polishing process 110 to form the oxide layer 116 on top of the conductive structure 114. Accordingly, the oxide layer 116 is the oxide of the conductive material (i.e. conductive material 108) of the conductive structure 114 in accordance with some embodiments.

Figure 1D:
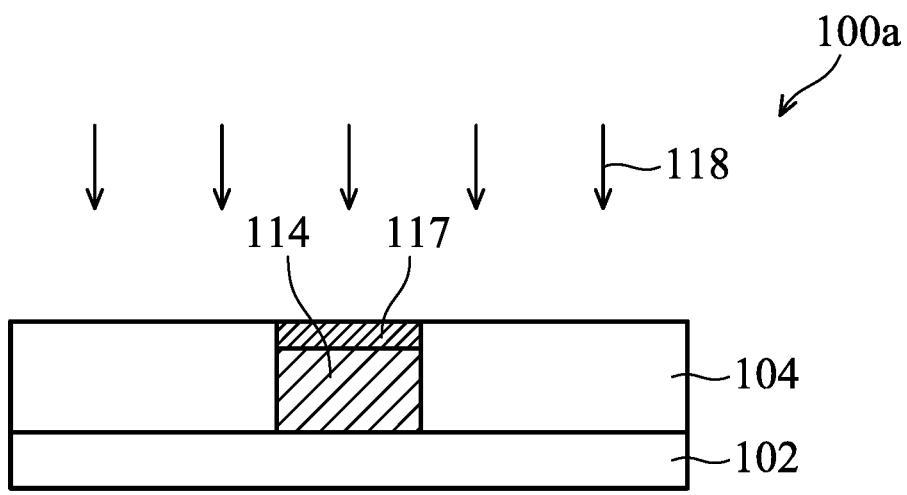

After the polishing process 110 is performed, a rinsing process 118 is performed to remove the slurry 112, as shown in FIG. 1D in accordance with some embodiments. In addition, the oxide layer 116 is reduced back to the conductive material to form a reduced conductive layer 117 over the conductive structure 114 in accordance with some embodiments.

In some embodiments, the rinsing process 118 includes rinsing the material layer 104 and the oxide layer 116 with a reducing solution. In some embodiments, the reducing solution includes a reducing agent which is configured to react with the oxide layer 116 so that the oxide layer 116 can be reduced to the original conductive material (i.e. conductive material 108) to form the reduced conductive layer 117, as shown in FIG. 1D in accordance with some embodiments. In some embodiments, an oxidizer is used in the polishing process 110 and a reducing agent is used in the rinsing process 118.

In some embodiments, the oxide layer 116 is fully reacted with the reducing agent used in the rinsing process 118, so that no oxide layer (e.g. the oxide layer 116) remains on the top surface of the conductive structure 114 after the rinsing process 118 is performed. Accordingly, the resistance of the conductive structure 114 may be improved.

The reducing agent in the reducing solution may be selected according to the conductive material of which the conductive structure 114 is made. In some embodiments, the standard electrode voltage of the conductive material of the conductive structure 114 is greater than the standard electrode voltage of the reducing agent. Accordingly, the reducing agent will react with the oxide layer 116, which is formed due to oxidation of the top portion of the conductive structure 114, so that the reduced conductive layer 117 is formed over the conductive structure 114 by reducing the oxide layer 116.

In some embodiments, a concentration of the reducing agent used in the reducing solution is greater than about 0.27 mmol. In some embodiments, a concentration of the reducing agent used in the reducing solution is greater than about 0.3 mmol. The reducing solution may include sufficient reducing agent, so that the oxide layer 116 can be reduced as designed. In addition, sufficient reducing agent may also help prevent metal corrosion during the rinsing process 118.

The reducing agent described above may be a gas or a liquid. In some embodiments, the conductive structure 114 is made of tungsten, and therefore the oxide layer 116 is made of tungsten oxide. In the embodiments where the conductive structure 114 is made of tungsten, the reducing agent in the reducing solution may be chosen to have a standard electrode voltage lower than that of the tungsten. For example, the reducing agent may include $H_3PO_2$, HOOCCOOH, or a combination thereof.

In some embodiments, the conductive structure 114 is made of cobalt, and therefore the oxide layer 116 is made of cobalt oxide. In the embodiments where the conductive structure 114 is made of cobalt, the reducing agent in the reducing solution may be chosen to have a standard electrode voltage lower than that of the cobalt. For example, the reducing agent may include $H_3PO_2$, HOOCCOOH, or a combination thereof.

In some embodiments, the conductive structure 114 is made of copper, and therefore the oxide layer 116 is made of copper oxide. In the embodiments where the conductive structure 114 is made of copper, the reducing agent in the reducing solution may be chosen to have a standard electrode voltage lower than that of the copper. For example, the reducing agent may include $H_2$.

The pH value of the reducing solution may also be adjusted according to the conductive material of the conductive structure 114. More specifically, the pH value of the reducing solution may be adjusted to a range of values to prevent the oxide layer 116 from dissolving in the reducing solution. The Pourbaix diagram of the conductive material of the conductive structure 114 may be used to determine the pH value of the reducing solution used in the rinsing process 118. More specifically, the pH value may be adjusted to the range of values in which the conductive material tends to be in its solid oxide state instead of its ion state, so that the oxide layer 116 does not tend to dissolve in the reducing solution during the rinsing process 118.

In the embodiments where the conductive structure 114 is made of tungsten, the pH value of the reducing solution used in the rinsing process 118 may be less than 4. In the embodiments where the conductive structure 114 is made of copper, the pH value of the reducing solution used in the rinsing process 118 may be greater than 6. In the embodiments where the conductive structure 114 is made of cobalt, the pH value of the reducing solution used in the rinsing process 118 may be greater than 9.

In some embodiments, the reducing solution further includes a pH value adjusting agent so that the pH value can be adjusted according to the chemical properties of the conductive material of the conductive structure 114. In some other embodiments, the pH value adjusting agent can be adjusted by the reducing agent added in the reducing solution to achieve the designed ranges of pH vale.

The rinsing process 118 may be performed to rinse the semiconductor structure after the polishing process 110 is performed, so that the abrasive and chemicals used in the polishing process 110 may be roughly removed and cross contamination may be prevent. However, as described previously, in the manufacturing process for forming the semiconductor structure 100a, the oxide layer 116 may be formed over the conductive structure 114 due to the polishing process 110. If the oxide layer 116 is too thick, the resistance of the conductive structure 114 may be too high. Therefore, the rinsing process 118 is performed using the reducing solution described above. During the rinsing process 118, not only the slurry 112 can be removed from the material layer 104 and the conductive structure 114 but the resistance of the resulting conductive structure 114 can also be reduced. In addition, by using the reducing agent in the rinsing process 118, metal corrosion during the rinsing process 118 may also be prevented.

Furthermore, as described previously, the pH value may be adjusted according to the properties of the conductive material of the conductive structure 114 to prevent the oxide layer 116 from dissolving into the reducing solution. If the oxide layer 116 continuously dissolves into the reducing solution during the rinsing process 118, a recess may be formed over the conductive structure 114 and the performance of the resulting semiconductor structure 100a may be undermined.

Figure 2:
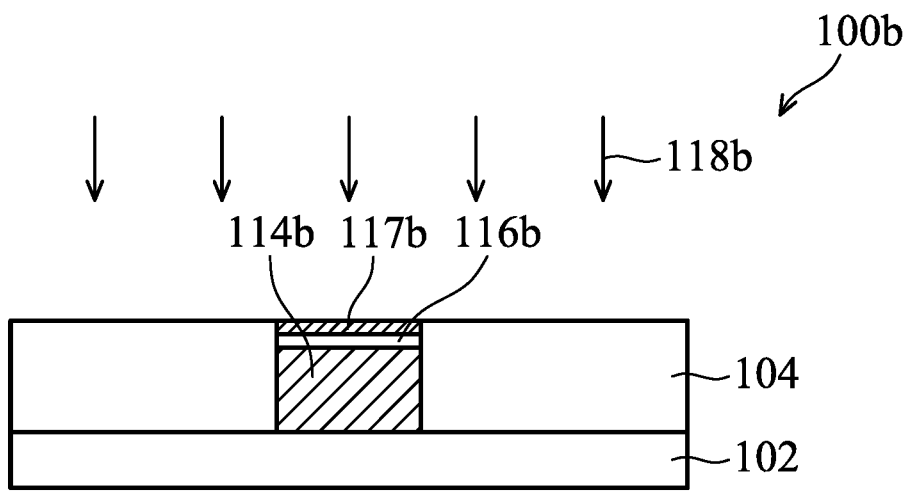
FIG. 2 is a cross-sectional representation of a semiconductor structure in accordance with some embodiments.

FIG. 2 is a cross-sectional representation of a semiconductor structure 100b in accordance with some embodiments. The semiconductor structure 100b is similar to, or the same as, the semiconductor structure 100a described previously, except the oxide layer formed over a conductive structure is not completely reduced. Some processes and materials used to form the semiconductor structure 100b may be similar to, or the same as, those used to form the semiconductor structure 100a described previously and are not repeated herein.

More specifically, processes shown in FIGS. 1A to 1C may be performed to form an oxide layer 116b over a conductive structure 114b after a polishing process (e.g. the polishing process 110 shown in FIG. 1C) is performed. Next, a rinsing process 118b is performed to remove the slurry used in the polishing process, as shown in FIG. 2 in accordance with some embodiments. In addition, a top portion of the oxide layer 116b is reduced to form a reduced conductive layer 117b during the rinsing process 118b in accordance with some embodiments.

The rinsing process 118b may be similar to the rinsing process 118 described previously. For example, the rinsing process 118b may also include using a reducing agent in a reducing solution, and the pH value of the reducing solution may be adjusted according to the conductive material on which the rinsing process 118b is applied. The composition of the reducing solution of the rinsing process 118b may be similar to, or the same as, that in the rinsing process 118 described previously and the description thereof is not repeated herein.

However, unlike the oxide layer 116 being completely reduced to form the reduced conductive layer 117 after the rinsing process 118 is performed, only a portion of the oxide layer 116b is reduced in the rinsing process 118b. The remaining oxide layer 116b may be seen as a protection layer in the manufacturing process. In addition, since a portion of the oxide layer 116b has been reduced, the remaining portion of the oxide layer 116b should be relatively thin so that the resistance will not be too high, while still being protective for the conductive structure 114b located below. In some embodiments, the top portion of the oxide layer 116b is reduced to form the reduced conductive layer 117b, while the bottom portion of the oxide layer 116b remains as an oxide layer.

As shown in FIG. 2, the semiconductor structure 100b includes the conductive structure 114b surrounded by the material layer 104, and the oxide layer 116b is formed over the conductive structure 114b. In addition, the top portion of the oxide layer 116b is reduced so that the thickness of the oxide layer 116b is reduced. Accordingly, the resistance of the conductive structure 114b may be reduced and the performance of the semiconductor structure 100b may be improved.

In addition, since the oxide layer 116b is formed due to the polishing process and the reduced conductive layer 117b is formed by reducing the top surface of the oxide layer 116b, the top surface of the reduced conductive layer 117b and the top surface of the material layer 104 can still be relatively flat. Accordingly, the performance of the semiconductor structure 100b, such as the connection between several conductive structures, may also be improved.

The processes shown in FIGS. 1A to 2 may be applied to various semiconductor structures. For example, the conductive structure (e.g. the conductive structure 114 and 114b) may be used as a conductive plug connecting to a source/drain structure in a transistor structure. FIGS. 3A to 3G are cross-sectional representations of various stages of forming a semiconductor structure 100c including a FinFET structure in accordance with some embodiments.

Figure 3A:
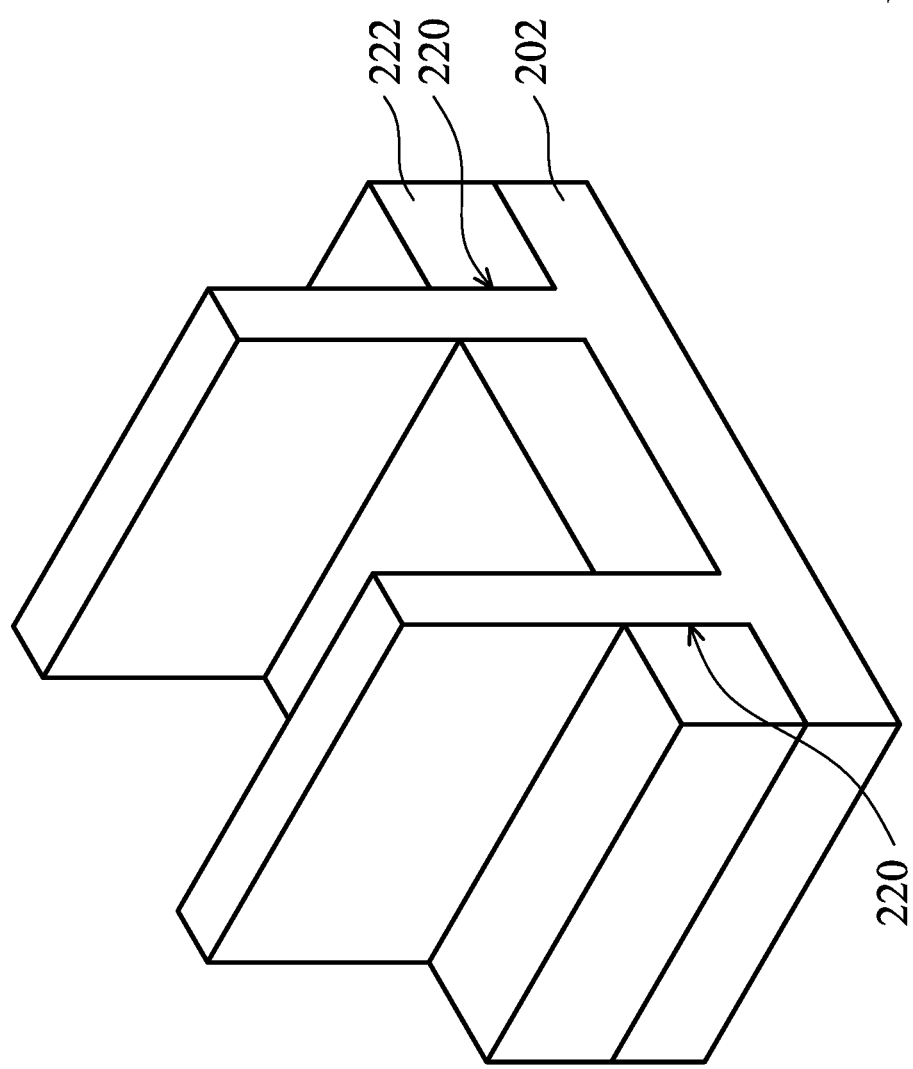
FIGS. 3A to 3G are cross-sectional representations of various stages of forming a semiconductor structure including a FinFET structure in accordance with some embodiments.

As shown in FIG. 3A, a substrate 202 is provided in accordance with some embodiments. The substrate 202 may be a semiconductor wafer such as a silicon wafer. Alternatively or additionally, the substrate 202 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, fin structures 220 are formed from the substrate 202, and an isolation structure 222 is formed around the fin structure 220, as shown in FIG. 3A in accordance with some embodiments. The fin structures 220 may be formed by patterning the substrate 202. The isolation structure 222 may be formed by forming an insulating material over the substrate 202 and the fin structures 220 and recessing the insulating material to expose the top portion of the fin structures 220. In some embodiments, the insulating material is made of silicon oxide, silicon nitride, silicon oxynitride, fluoride-doped silicate glass (FSG), or other low-K dielectric materials. The insulating material may be formed by using a high-density-plasma (HDP) CVD process, although other deposition processes may be used in other embodiments.

Figure 3B:
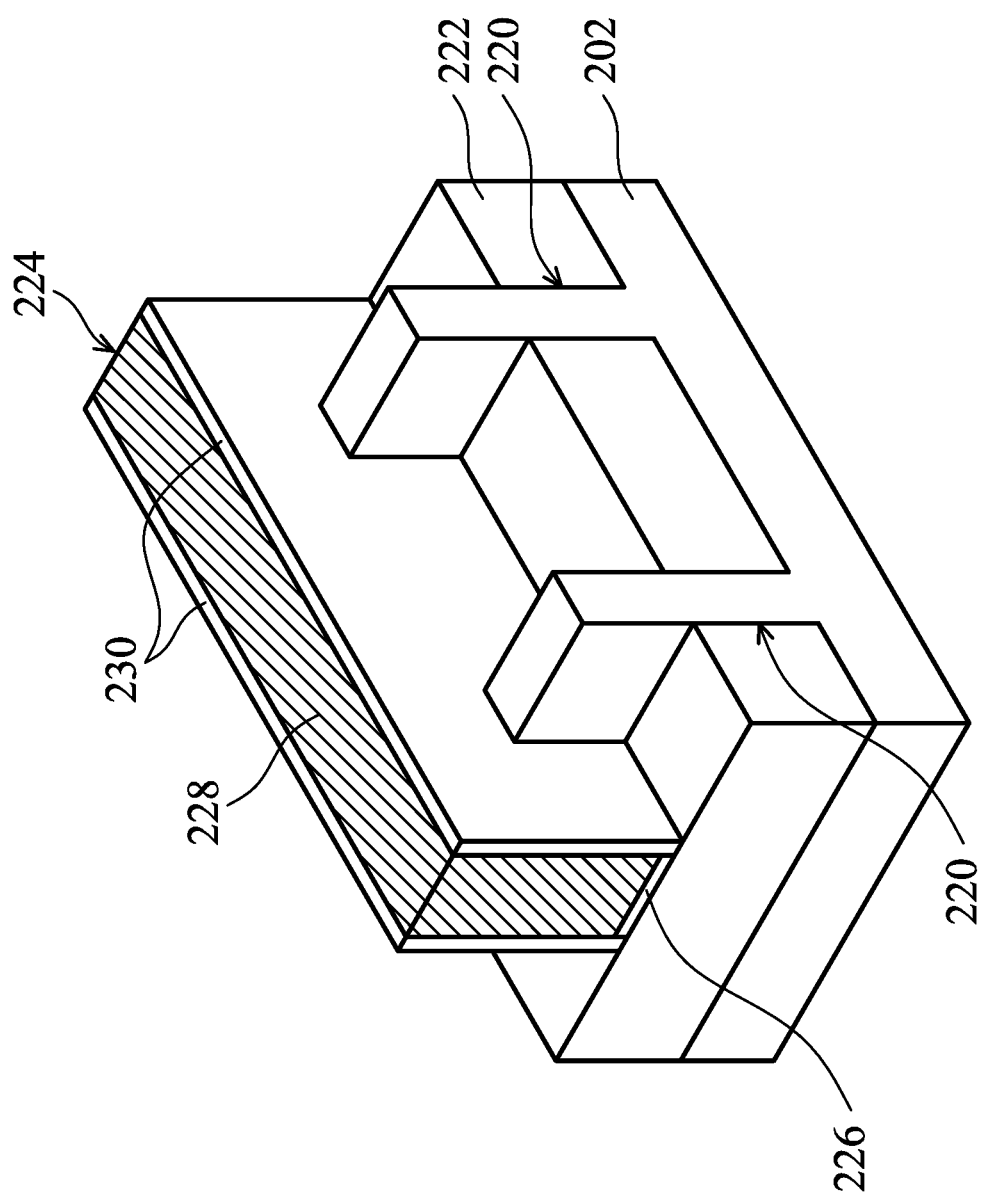

Afterwards, a gate structure 224 is formed over the fin structures 220, as shown in FIG. 3B in accordance with some embodiments. As shown in FIG. 3B, the gate structure 224 is formed across the fin structures 220 and extends over the isolation structure 222. In some embodiments, the gate structure 224 is a dummy gate structure which will be replaced by a metal gate structure afterwards. In some embodiments, the gate structure 224 includes a gate dielectric layer 226 and a gate electrode layer 228.

In some embodiments, the gate dielectric layer 226 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, silicon oxide, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

The gate electrode layer 228 is formed over the gate dielectric layer 226. The gate electrode layer 228 may include a single layer or multilayer structure. In some embodiments, the gate electrode layer 228 is made of polysilicon.

The gate structure 224 may be formed by a procedure including deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Spacers 230 are formed on the sidewalls of the gate structure 224, as shown in FIG. 3B in accordance with some embodiments. The spacers 230 may protect the gate structure 224 from damage or loss during subsequent processing and may also prevent oxidation during subsequent processing. In some embodiments, the spacers 230 are made of silicon nitride, silicon oxide, silicon oxynitride, silicon carbide, or other applicable dielectric materials. The spacers 230 may include a single layer or multiple layers.

Figure 3C:
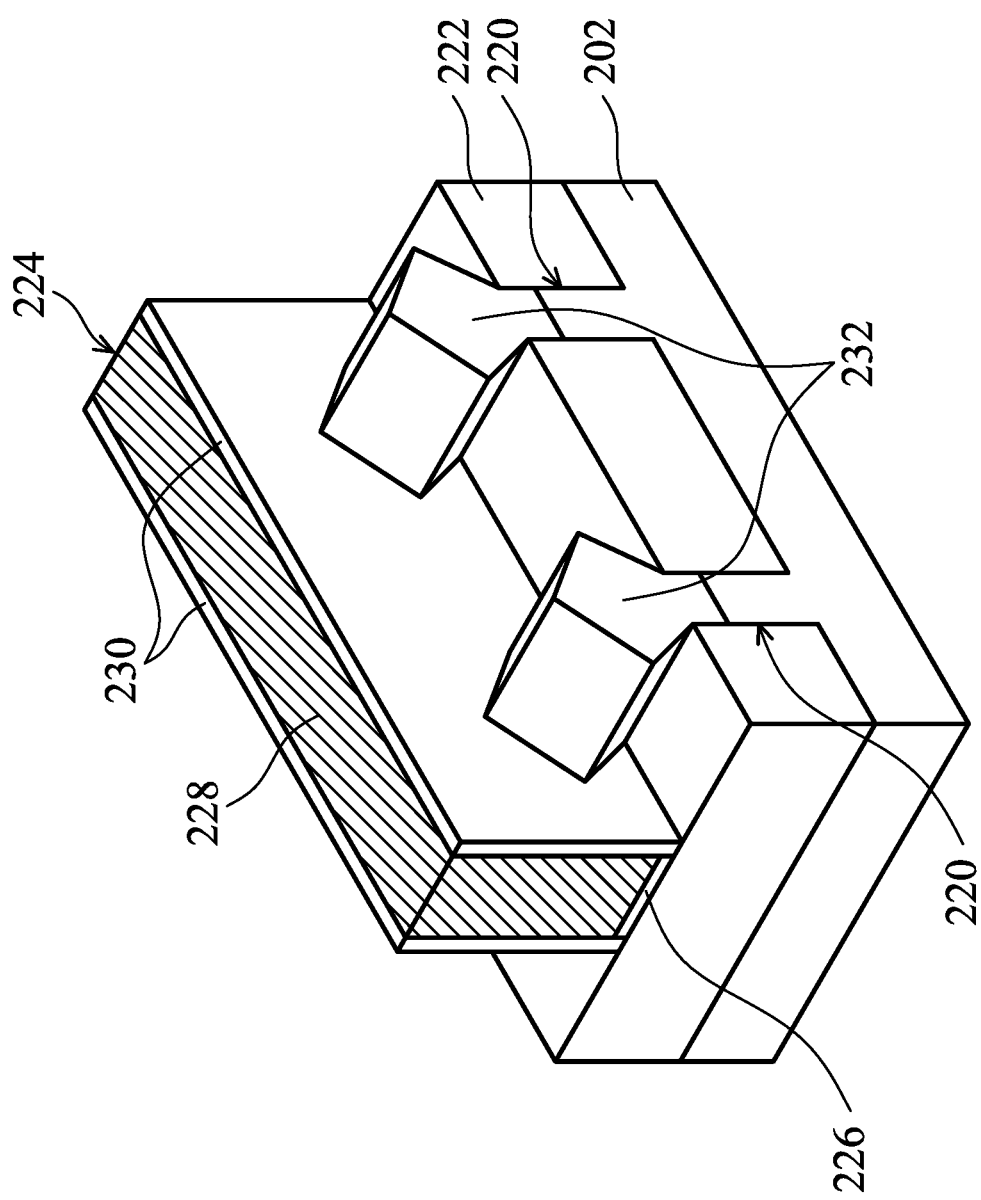

After the gate structure 224 is formed, source/drain structures 232 are formed in the fin structures 220, as shown in FIG. 3C in accordance with some embodiments. In addition, the source/drain structures 232 are formed at opposite sides of the gate structure 224 in accordance with some embodiments. The source/drain structures 232 may be formed by recessing the fin structures 220 and growing semiconductor materials in the recesses by performing epitaxial (epi) processes. In some embodiments, the source/drain structures 232 include Ge, SiGe, InAs, InGaAs, InSb, GaAs, GaSb, InAlP, InP, or a combination thereof.

Figure 3D:
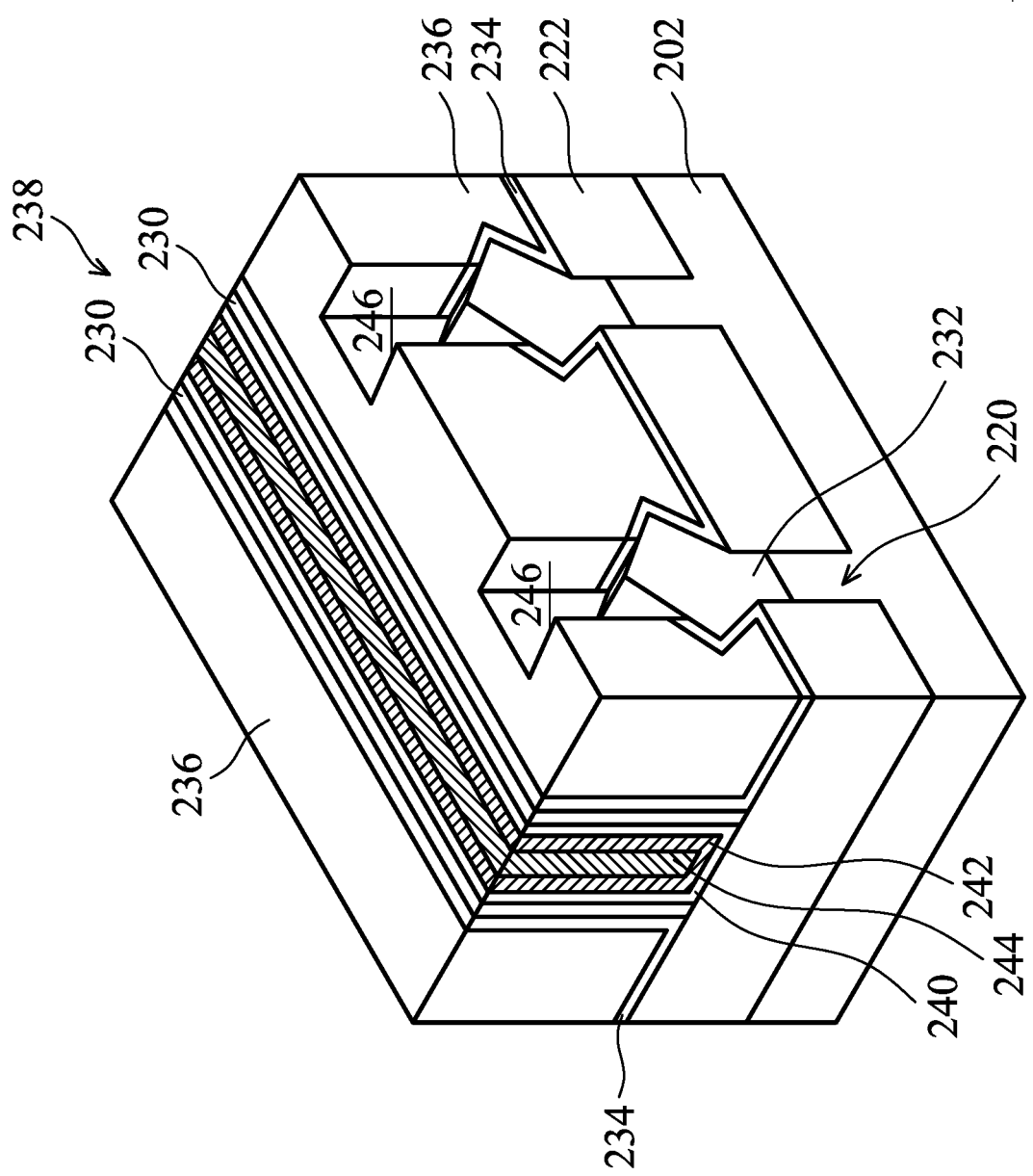

After the source/drain structures 232 are formed, a contact etch stop layer (CESL) 234 is formed over substrate 202, and an interlayer dielectric layer 236 is formed over the contact etch stop layer 234, as shown in FIG. 3D in accordance with some embodiments. In some embodiments, the contact etch stop layer 234 is made of silicon nitride, silicon oxynitride, and/or other applicable materials. The contact etch stop layer 234 may be formed by performing plasma enhanced CVD, low pressure CVD, ALD, or other applicable processes.

The interlayer dielectric layer 236 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 236 may be formed by performing chemical vapor deposition (CVD), physical vapor deposition, (PVD), atomic layer deposition (ALD), spin-on coating, or other applicable processes.

Next, the gate structure 224 is replaced by a metal gate structure 238, as shown in FIG. 3D in accordance with some embodiments. In some embodiments, the metal gate structure 238 includes a gate dielectric layer 240, a work function metal layer 242, and a gate electrode layer 244.

In some embodiments, the gate dielectric layer 240 is made of metal oxides, metal nitrides, metal silicates, transition metal-oxides, transition metal-nitrides, transition metal-silicates, or oxynitrides of metals. Examples of materials used to form the gate dielectric layer 240 include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

In some embodiments, the work function metal layer 242 is formed over the gate dielectric layer 240. The work function metal layer 242 may be tuned to have the proper work function. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

In some embodiments, the gate electrode layer 244 is formed over the work function metal layer 242. In some embodiments, the gate electrode layer 244 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

Next, trenches 246 are formed through the interlayer dielectric layer 236 to expose the top surfaces of the source/drain structures 232, as shown in FIG. 3D in accordance with some embodiments. The trenches 246 may be formed by forming a mask layer over the interlayer dielectric layer 236 and etching the interlayer dielectric layer 236 through the openings of the mask layer.

After the trenches 246 are formed, silicide layers 248 is formed over the exposed portions of the top surfaces of the source/drain structures 232 in accordance with some embodiments. The silicide layers 248 may be formed by forming metal layers over the top surfaces of the source/drain structures 232, reacting the metal layers with the source/drain structures 232 to form the silicide layers, and removing the unreacted metal layers.

Figure 3E:
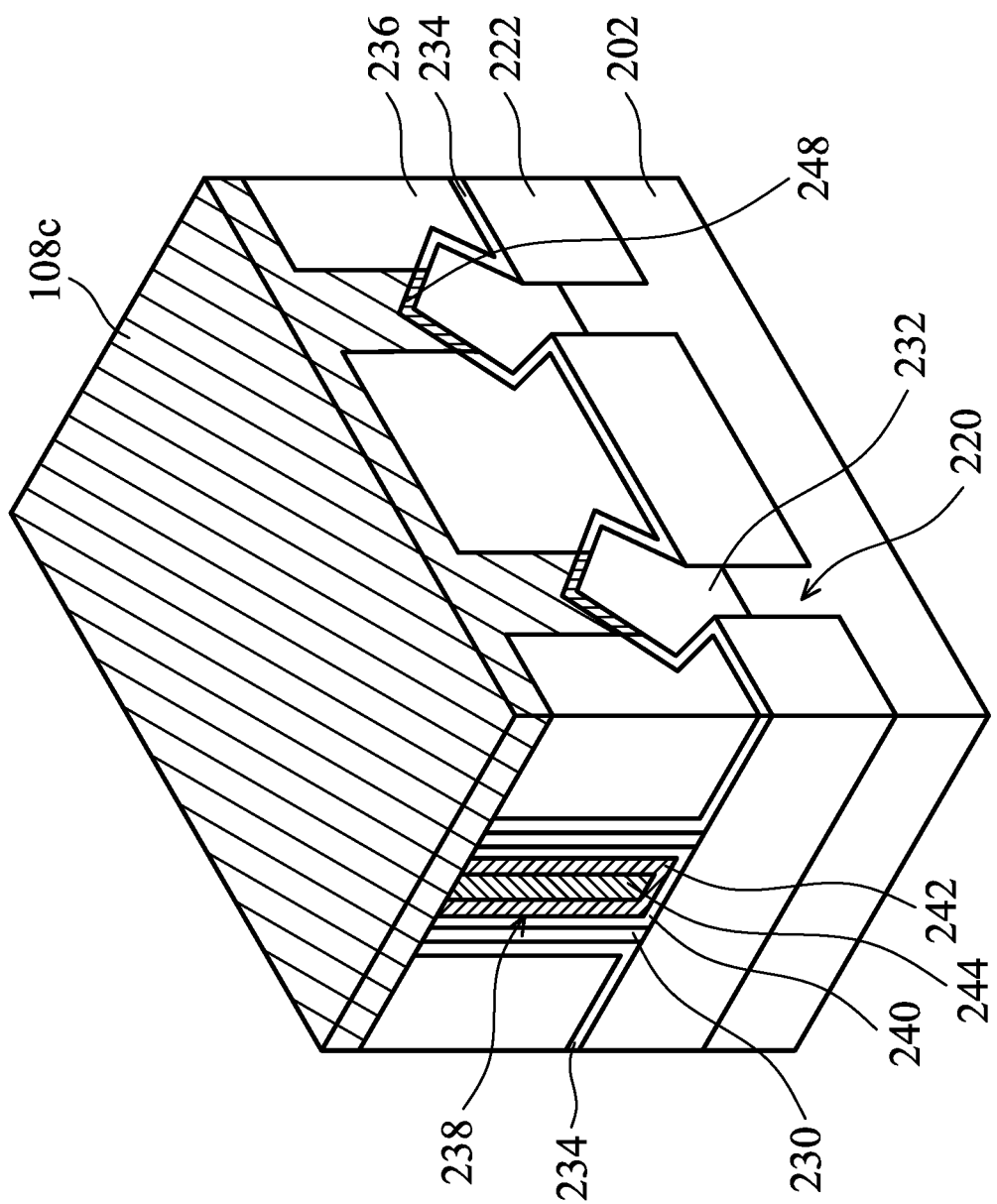

Afterwards, processes shown in FIGS. 1A to 1D may be performed to form a conductive structure in the trenches 246. More specifically, the interlayer dielectric layer 236 may be seen as the material layer 104 and the trenches 246 may be seen as the trenches 106 shown in FIGS. 1A to 1D. In some embodiments, a conductive material 208 is formed in the trenches 246 over the silicide layers 248 and is formed over the top surface of the interlayer dielectric layer 236, as shown in FIG. 3E in accordance with some embodiments. The conductive material 108c may be the same as, or similar to, the conductive material 108 described previously and is not repeated herein.

Figure 3F:
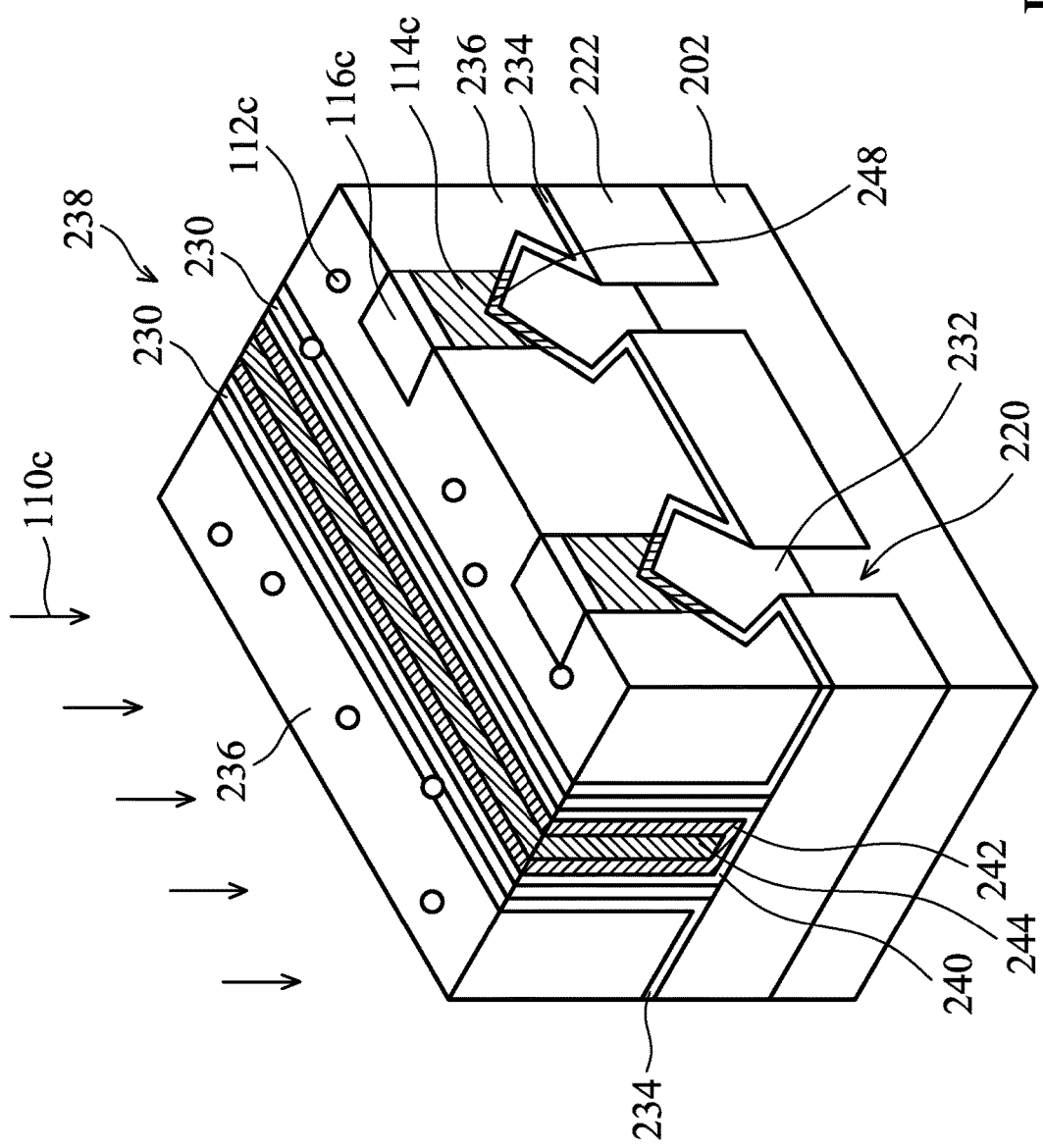

After the conductive material 108c is formed, a polishing process 110c is performed, as shown in FIG. 3F in accordance with some embodiments. The polishing process 110c may be the same as, or similar to, the polishing process 110 described previously. During the polishing process 110c, slurry 112c is used to polish the conductive material 108c formed over the top surface of the interlayer dielectric layer 236 in accordance with some embodiments.

The polishing process 110c may be performed until the top surface of the interlayer dielectric layer 236 is exposed to form a conductive structure 114c, as shown in FIG. 3F in accordance with some embodiments. In addition, an oxide layer 116c is formed on top of the conductive structure 114c due to the polishing process in accordance with some embodiments. As described previously, the top portion of the conductive structure 114c exposed to the slurry 112c may be oxidized during the polishing process 110c to form the oxide layer 116c, and therefore the oxide layer 116c is the oxide of the conductive material (i.e. conductive material 108c) of the conductive structure 114c.

Figure 3G:
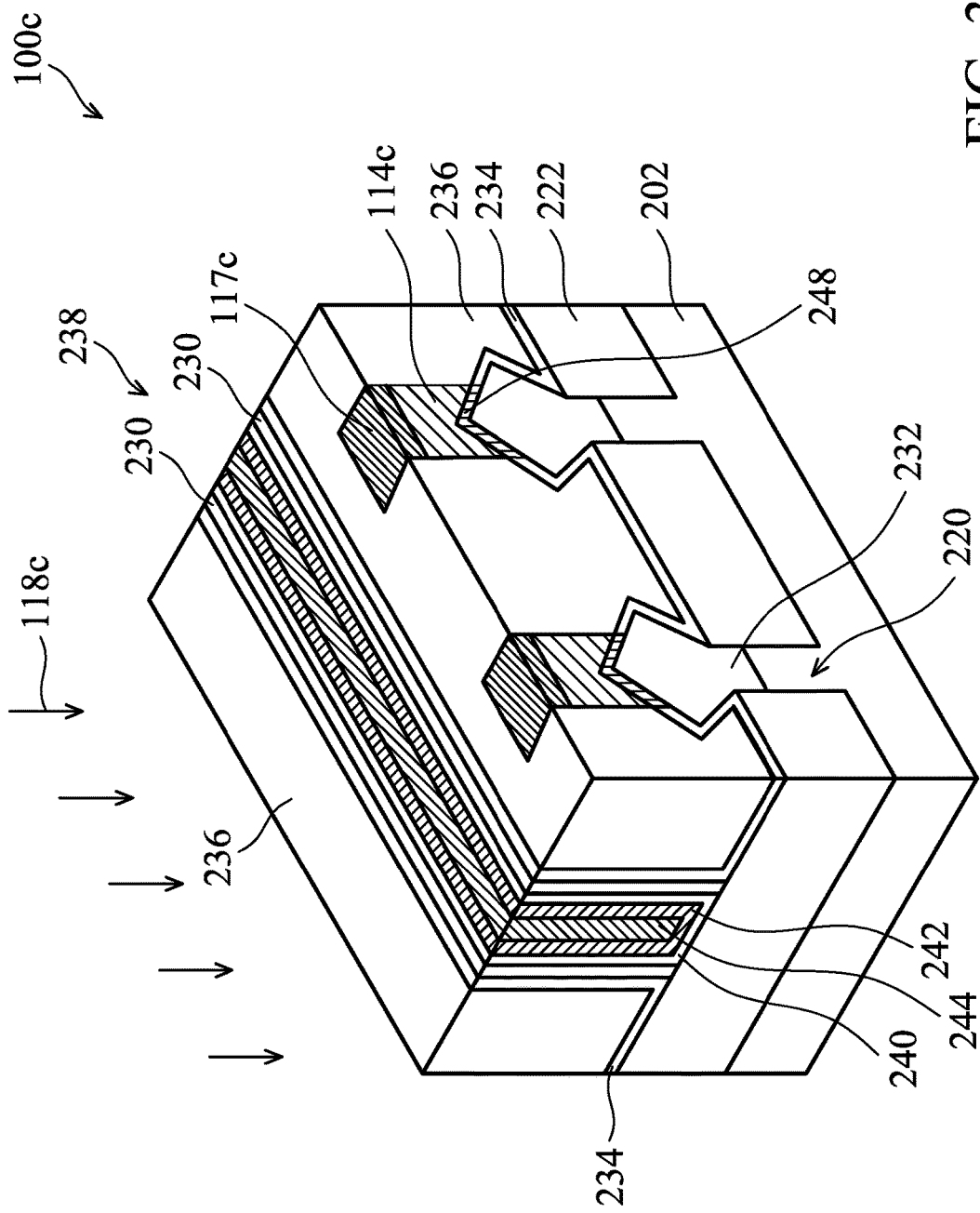

After the polishing process 110c is performed, a rinsing process 118c is performed to remove the slurry 112c, as shown in FIG. 3G in accordance with some embodiments. In addition, the oxide layer 116c is reduced by the reducing agent in rinsing process 118c to form a reduced conductive layer 117c over the conductive structure 114c in accordance with some embodiments.

The rinsing process 118c may be the same as, or similar to the rinsing process 118 described previously. For example, the rinsing process 118c may include rinsing the interlayer dielectric layer 236 and the oxide layer 116c with a reducing solution. In some embodiments, the reducing solution includes a reducing agent which is configured to react with the oxide layer 116c so that the oxide layer 116c can be reduced back to the original conductive material (i.e. conductive material 108c) to form the reduced conductive layer 117c. The reducing solution and the reducing agent of the rinsing process 118c may be the same as, or similar to those of the rinsing process 118 described previously and are not repeated herein.

In some embodiments, oxide layer 116c is completely reduced to form the reduced conductive layer 117c after the rinsing process 118c is performed. Accordingly, the resistance of the conductive structure 114c may be improved.

As described previously, the reducing solution including the reducing agent is used in the rinsing process 118c to remove the slurry 112c used in the polishing process 110c and also to reduce the oxide layer 116c, so that the resistance in the semiconductor structure 100c may be improved.

In addition, in the semiconductor structure 100c, the conductive structure 114c may be electrically connected to other elements/devices, and an electronic circuit may be formed in the semiconductor structure 100c. The electronic circuit may result in the tendency of losing electrons of the conductive structure 114c during the rinsing process 118c. That is, the conductive structure 114c may tend to be oxidized continuously during the rinsing process 118c. Therefore, the reducing agent used in the rinsing process 118c may not only react with the oxide layer 116c formed during the polishing process 110c but also prevent the conductive structure 114c from being oxidized due to the internal electronic circuit during the rinsing process 118c. Accordingly, the resistance of the resulting conductive structure 114c may be reduced, and the performance of the semiconductor structure 100c may be improved.

Furthermore, as described previously, the pH value may be adjusted according to the properties of the conductive material of the conductive structure 114c to prevent the oxide layer 116c from dissolving into the reducing solution. In addition, as described above, when an electronic circuit exist in the semiconductor structure 100c, the conductive structure 114c may tend to lose electrons and therefore be oxidized continuously during the rinsing process 118c. Therefore, if the oxidized conductive material of the conductive structure 114c tends to be dissolved in the rinsing solution, a recess may be formed due to the oxide being continuously formed and dissolved. Accordingly, the rinsing solution may be adjusted to prevent the oxide of the conductive material of the conductive structure 114c from dissolving in the rinsing solution, so that the recess will not be formed over the conductive structure 114c. Since the formation of the recesses formed over the conductive structure 114c may result in forming short circuit or misconnecting of the conductive structure 114c, the problems can be reduced by using the reducing solution in the rinsing process 118c. As a result, the performance of the semiconductor structure 100c may be improved.

Figure 4:
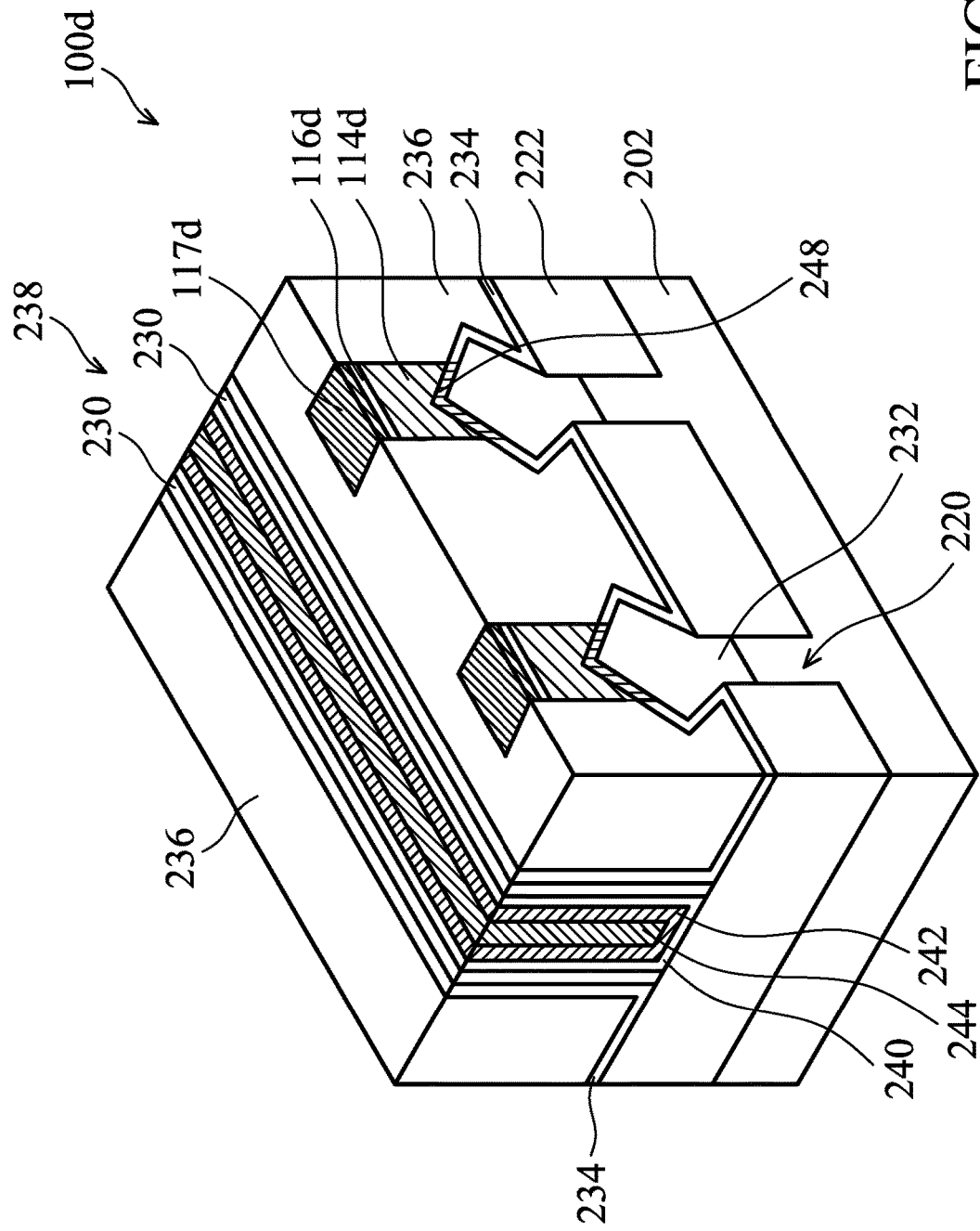
FIG. 4 is a cross-sectional representation of a semiconductor structure in accordance with some embodiments.

FIG. 4 is a cross-sectional representation of a semiconductor structure 100d in accordance with some embodiments. The semiconductor structure 100d is similar to, or the same as, the semiconductor structure 100c described previously, except that an oxide layer 116d formed over a conductive structure 114d is not completely reduced, similar to those shown in FIG. 2. That is, only the top portion of the oxide layer 116d is reduced to form a reduced conductive layer 117d over the oxide layer 116d.

Figure 5:
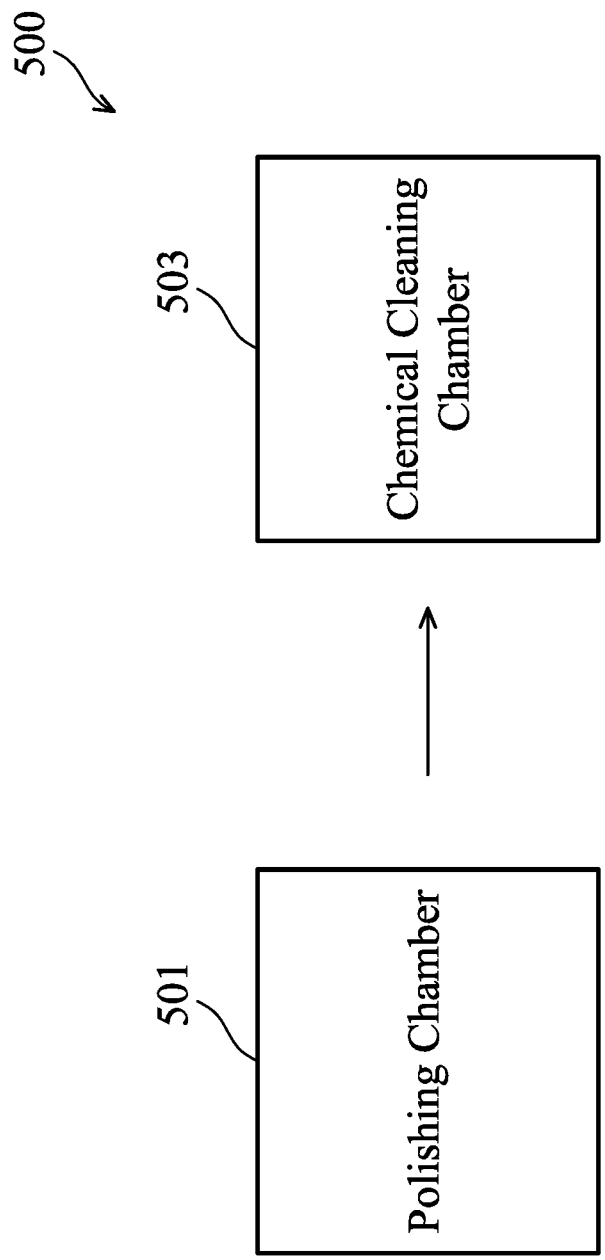
FIG. 5 shows a system including a polishing chamber for forming a semiconductor structure in accordance with some embodiments.

As described above, a rinsing process (e.g. the rinsing processes 118, 118b, 118c, or 118d) includes using a reducing solution having a reducing agent. Therefore, the rinsing process may help reduce the oxide layer formed during a polishing process and to prevent more oxide from being formed during the rinsing process. The polishing process and the rinsing process described above may be performed in a polishing chamber. FIG. 5 shows a system 500 including a polishing chamber for forming a semiconductor structure in accordance with some embodiments.

As shown in FIG. 5, the system 500 includes a polishing chamber 501 and a chemical cleaning chamber 503 in accordance with some embodiments. Both the polishing process and the rinsing process described above may be performed in the polishing chamber 501. More specifically, a semiconductor structure, such as the semiconductor structures shown in FIG. 1B or 3E, may be transferred into the polishing chamber 501 to perform a polishing process (e.g. the polishing process 110 or 220). After the semiconductor structure is polished, a first rinsing process may also be performed in the polishing chamber 501, so that the oxidized portion of the conductive structure in the semiconductor structure may be reduced. The first rinsing process may be similar to, or the same as, the rinsing processes 118, 118b, or 118c described previously and detail description of the process is not repeated herein.

After the polishing process and the first rinsing process are performed, the semiconductor structure may be transferred to the chemical cleaning chamber 503, as shown in FIG. 5 in accordance with some embodiments. In the chemical cleaning chamber 503, a chemical cleaning process may be performed by using a chemical solution. The chemical cleaning process may be configured to remove abrasives, organic residue, or the like.

After the chemical cleaning process is performed, a second rinsing process may be performed in the chemical cleaning chamber 503 to clean the semiconductor structure. In addition, the second rinsing process may also help to reduce the oxidized portion of the conductive structure formed due to the chemical cleaning process. The second rinsing process may be similar to, or the same as, the rinsing processes 118, 118b, or 118c described previously and detail description of the process is not repeated herein. The reducing solution used in the second rinsing process may prevent (or reduce) the semiconductor structure from being oxidized. In some embodiments, the first rinsing process and the second rinsing process include a same reducing agent. In some embodiments, the reducing solution used in the first rinsing process is the same as that used in the second rinsing process.

In addition, during the process for transferring the semiconductor structure from the polishing chamber 501 to the chemical cleaning chamber 503, a third rinsing process may also be performed to keep the semiconductor structure being wet while preventing oxidization of the conductive structure in the semiconductor structure. The third rinsing process may be similar to, or the same as, the rinsing processes 118, 118b, or 118c described previously and detail description of the process is not repeated herein. Similarly, the reducing solution used in the third rinsing process may prevent (or reduce) the semiconductor structure from being oxidized.

In some embodiments, the first rinsing process, the second rinsing process, and the third rinsing process include a same reducing agent. In some embodiments, the reducing solutions used in the first rinsing process, the second rinsing process, and the third rinsing process are the same.

Embodiments of methods for forming a semiconductor structure are provided. The method may include forming a conductive material in a trench and remove an additional portion of the conductive material to form a conductive structure by performing a polishing process. After the polishing process is performed, a rinsing process including using a reducing solution is performed. The reducing solution includes a reducing agent, so that oxide formed over the conductive structure due to the polishing process may be reduced during the rinsing process. Therefore, the resistance of the conductive structure may be reduced.

In some embodiments, a method for forming a semiconductor structure is provided. The method for forming a semiconductor structure includes forming a conductive material in the trench and over a top surface of the material layer and polishing the conductive material with a slurry to expose the top surface of the material layer and to form a conductive structure in the trench. The method for forming a semiconductor structure further includes forming a material layer over a substrate and forming a trench in the material layer. The method for forming a semiconductor structure further includes removing the slurry with a reducing solution. In addition, the reducing solution comprises a reducing agent, and a standard electrode voltage of the conductive material is greater than a standard electrode voltage of the reducing agent.

In some embodiments, a method for forming a semiconductor structure is provided. The method for forming a semiconductor structure includes forming a material layer over a substrate and forming a trench in the material layer. The method for forming a semiconductor structure further includes filling the trench with a conductive material and polishing the conductive material with a slurry to form a conductive structure. In addition, a top portion of the conductive structure is oxidized to form an oxide layer. The method for forming a semiconductor structure further includes reacting the oxide layer with a reducing agent in a first reducing solution. In addition, a standard electrode voltage of the conductive material is greater than a standard electrode voltage of the reducing agent.

In some embodiments, a method for forming a semiconductor structure is provided. The method for forming a semiconductor structure includes forming a dielectric layer over a substrate and forming a trench in the dielectric layer. The method for forming a semiconductor structure further includes depositing a conductive material in the trench and over the dielectric layer and polishing the conductive material to form a conductive structure with an oxide layer formed on top of the conductive structure. The method for forming a semiconductor structure further includes rinsing the dielectric layer with a reducing solution comprising a reducing agent. In addition, the oxide layer is reduced by reacting with the reducing agent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a material layer over a substrate;
   forming a trench in the material layer;
   forming a conductive material in the trench and over a top surface of the material layer;
   polishing the conductive material with a slurry to expose the top surface of the material layer and to form a conductive structure in the trench; and
   removing the slurry with a reducing solution, wherein the reducing solution comprises a reducing agent, and a standard electrode voltage of the conductive material is greater than a standard electrode voltage of the reducing agent,
   wherein the conductive material is polished in a polishing chamber, and wherein another reducing solution comprising the reducing agent is applied to the material layer and the conductive structure when the substrate is transferred from the polishing chamber to a chemical cleaning chamber.

2. The method for forming a semiconductor structure as claimed in claim 1, wherein a top portion of the conductive structure is oxidized to form an oxide layer over the conductive structure.

3. The method for forming a semiconductor structure as claimed in claim 2, wherein the oxide layer is reduced by reacting with the reducing agent.

4. The method for forming a semiconductor structure as claimed in claim 2, wherein a top portion of the oxide layer reacts with the reducing agent to form a reduced conductive layer over the oxide layer.

5. The method for forming a semiconductor structure as claimed in claim 1, further comprising:
   performing a chemical cleaning process on the material layer.

6. The method for forming a semiconductor structure as claimed in claim 5, wherein the chemical cleaning process is performed in the chemical cleaning chamber.

7. The method for forming a semiconductor structure as claimed in claim 5, further comprising:
   performing a second rinsing process on the material layer and the conductive structure after the chemical cleaning process is performed, wherein the reducing agent is used in the second rinsing process, and the second rinsing process is performed in the chemical cleaning chamber.

8. A method for forming a semiconductor structure, comprising:
   forming a material layer over a substrate;
   forming a trench in the material layer;
   filling the trench with a conductive material;
   polishing the conductive material with a slurry to form a conductive structure, wherein a top portion of the conductive structure is oxidized to form an oxide layer;
   reacting the oxide layer with a reducing agent in a first reducing solution,
   wherein a standard electrode voltage of the conductive material is greater than a standard electrode voltage of the reducing agent;
   performing a chemical cleaning process on the material layer and the conductive structure after the oxide layer is reacted with the reducing agent in the first reducing solution; and
   rinsing the material layer and the conductive structure by providing a second reducing solution after the chemical cleaning process is performed, wherein the first reducing solution and the second reducing solution comprise a same reducing agent.

9. The method for forming a semiconductor structure as claimed in claim 8, wherein the slurry is removed with the first reducing solution.

10. The method for forming a semiconductor structure as claimed in claim 8, wherein the steps of polishing the conductive material with a slurry and reacting the oxide layer with a reducing agent in a first reducing solution are performed in a polishing chamber.

11. The method for forming a semiconductor structure as claimed in claim 10,
   wherein the chemical cleaning process and the rinsing after the chemical cleaning process are performed in a chemical cleaning chamber.

12. The method for forming a semiconductor structure as claimed in claim 11, further comprising:
   rinsing the material layer with a third reducing solution when the substrate is transferred from the polishing chamber to the chemical cleaning chamber.

13. The method for forming a semiconductor structure as claimed in claim 12, wherein the first reducing solution and the third reducing solution comprise the same reducing agent.

14. The method for forming a semiconductor structure as claimed in claim 10, wherein a top portion of the oxide layer reacted is reduced to form a reduced conductive layer over the oxide layer.

15. A method for forming a semiconductor structure, comprising:
   forming a dielectric layer over a substrate;
   forming a trench in the dielectric layer;
   depositing a conductive material in the trench and over the dielectric layer;
   polishing the conductive material in a polishing chamber to form a conductive structure with an oxide layer formed on top of the conductive structure;
   rinsing the dielectric layer with a reducing solution comprising a reducing agent, wherein the oxide layer is reduced by reacting with the reducing agent;
   rinsing the dielectric layer and the conductive structure with a second reducing solution comprising the reducing agent in a chemical cleaning chamber, wherein the dielectric layer and the conductive structure are rinsed with a third reducing solution comprising the reducing agent when the substrate is transferred from the polishing chamber to the chemical cleaning chamber.

16. The method for forming a semiconductor structure as claimed in claim 15, further comprising:
   forming a gate structure over the substrate; and
   forming a source/drain structure in the substrate adjacent to the gate structure,
   wherein the dielectric layer is formed over the source/drain structure, and a top surface of the source/drain structure is exposed by the trench before the conductive material is deposited.

17. The method for forming a semiconductor structure as claimed in claim 15, wherein a standard electrode voltage of the conductive material is greater than a standard electrode voltage of the reducing agent.

18. The method for forming a semiconductor structure as claimed in claim 15, wherein the conductive material is copper, and the reducing agent is $H_2$.

19. The method for forming a semiconductor structure as claimed in claim 15, wherein the conductive material is tungsten or cobalt, and the reducing agent is $H_3PO_2$ and/or HOOCCOOH.

20. The method for forming a semiconductor structure as claimed in claim 15, wherein the conductive material is copper and a pH value of the reducing solution is greater than 6, or the conductive material is tungsten and a pH value of the reducing solution is less than 4, or the conductive material is cobalt and a pH value of the reducing solution is greater than 9.

\* \* \* \* \*